United States Patent
Ouvrier-Buffet et al.

(10) Patent No.: US 7,436,165 B2
(45) Date of Patent: Oct. 14, 2008

(54) DEVICE FOR MEASURING VERY SHORT CURRENT PULSES

(75) Inventors: Patrice Ouvrier-Buffet, Saint Jorioz (FR); Jean-Pierre Rostaing, La Cote Saint Andre (FR)

(73) Assignee: Commissariat A l'Energie Atomique (FR)

( * ) Notice: Subject to any disclaimer, the term of this patent is extended or adjusted under 35 U.S.C. 154(b) by 88 days.

(21) Appl. No.: 11/517,596

(22) Filed: Sep. 8, 2006

(65) Prior Publication Data

US 2007/0069822 A1    Mar. 29, 2007

(30) Foreign Application Priority Data

Sep. 9, 2005   (FR) ................... 05 09223

(51) Int. Cl.
  *G01R 19/00* (2006.01)
  *G01R 22/00* (2006.01)
(52) U.S. Cl. ............... 324/76.11; 324/76.17; 327/103; 702/64
(58) Field of Classification Search .............. 324/76.17; 702/64; 327/103
  See application file for complete search history.

(56) References Cited

U.S. PATENT DOCUMENTS

| | | | | |
|---|---|---|---|---|
| 3,350,574 A | * | 10/1967 | James | 327/114 |
| 3,628,116 A | * | 12/1971 | Preikschat | 318/590 |
| 3,869,666 A | * | 3/1975 | Saltz et al. | 324/76.25 |
| 3,944,920 A | * | 3/1976 | Borer | 324/111 |
| 4,232,372 A | * | 11/1980 | Berent | 702/141 |
| 5,191,332 A | * | 3/1993 | Shieu | 341/143 |
| 5,770,956 A | * | 6/1998 | Rolff | 327/103 |
| 6,211,664 B1 | | 4/2001 | Bonnefoy et al. | |
| 6,998,850 B2 | * | 2/2006 | Baumgartner | 324/522 |

FOREIGN PATENT DOCUMENTS

WO    2004-051314    6/2004
WO    2004/051314    6/2004

* cited by examiner

*Primary Examiner*—Vincent Q. Nguyen
*Assistant Examiner*—John Zhu
(74) *Attorney, Agent, or Firm*—Lowe Hauptman Ham & Berner, LLP

(57) ABSTRACT

An apparatus adapted to measure of current pulses that are very brief (a few nanoseconds) and of very low amplitude (a few microamps), such as those that can emanate from a photodetector used for the optical transmission of data at very high speed, or from a photodetector (photodiode or photoconductor) subject to a radiation that is of pulsed nature (in particular: X, gamma and other radiations). The circuit includes an integration stage (IT), a differentiation stage (DR), and a subtraction stage (SS). The time constants $Rp.Cint$ and $R2.C2$ of the integration and differentiation stages are preferably equal.

4 Claims, 2 Drawing Sheets

DEVICE FOR MEASURING VERY SHORT CURRENT PULSES

RELATED APPLICATION

The present application is based on, and claims priority from, France Application Number 05 09223, filed Sep. 9, 2005, the disclosure of which is hereby incorporated by reference herein in its entirety.

FIELD OF THE INVENTION

The invention relates to the measurement of current pulses that are very brief (a few nanoseconds) and of very low amplitude (a few microamps), such as those that can emanate from a photodetector used for the optical transmission of data at very high speed, or from a photodetector (photodiode or photoconductor) subject to a radiation of pulsed nature (in particular: X, gamma and other radiations).

The term "pulse measurement" is used here to mean, generally, either the simple detection of the presence of pulses (for example, for the digital transmission of data), or the measurement of characteristics of these pulses (amplitude, duration, in particular).

BACKGROUND OF THE INVENTION

The pulses to be measured are normally applied to a detection subsystem mainly comprising an amplifier called a "transimpedance" amplifier.

The main function of a transimpedance amplifier is to convert an input current Iin into an output voltage Vout, with a transfer function of the type Vout/Iin=−R1/(1+R1.C1.s) where s is the sampling variable or the Laplace variable, that is, a variable representing a frequency or a frequency component of the variable input current, R1 the value of a resistor and C1 the value of a capacitor. A transimpedance amplifier conventionally comprises a high-gain amplifier having for feedback, between its output and its input, a resistor of value R1 in parallel with a capacitor of value C1.

The transfer function of such a transimpedance amplifier is a function of the frequency, via the variable s. The cut-off frequency for which the output voltage loses three decibels compared to what it would be at low frequency is Fc=1/(2πR1.C1).

The transimpedance gain, that is, the amplitude of the voltage obtained for a given input current amplitude, is fixed by the value of R1, a value that is also involved in the cut-off frequency. The signal-to-noise ratio increases with the value of R1, but the bandwidth is then reduced accordingly. This configuration does not therefore allow for both a high bandwidth and a good signal-to-noise ratio.

The capacitor C1 is essential to the correct operation of the amplifier, because it ensures the stability of the configuration. It is chosen according to the desired gain and the desired frequency of use, and it is also chosen according to the input capacitance of the transimpedance amplifier (similar to a stray capacitance) and according to the absolute value G of the natural gain of the high-gain amplifier which forms the core of the transimpedance amplifier.

In a current pulse detection subsystem, the transimpedance amplifier can be followed by a voltage amplifier that is used to obtain a sufficient voltage level at the output if the transimpedance amplifier does not directly supply a sufficient level.

The object of the invention is to propose a pulse detection circuit with which to optimize the trade-off between the bandwidth and signal-to-noise ratio characteristics of the detection subsystem.

SUMMARY OF THE INVENTION

To achieve this, the invention proposes a circuit for measuring brief current pulses comprising:
an integrator stage comprising a first high-gain amplifier, the output of which is looped back to the input via a resistor of value Rp and a capacitor of value Cint;
a differentiator stage comprising a second high-gain amplifier, an input capacitor of value C2 in series between the output of the integrator stage and the input of the second high-gain amplifier, the second amplifier having its output looped back to its input via a resistor of value R2;
a subtractor stage receiving on a first input the output from the integrator stage and on a second input the output from the differentiator stage and supplying on its output the difference between the voltages on its two inputs.

Preferably, for optimal operation of the circuit, the resistor and capacitor values are chosen such that the product R2.C2 is as close as possible to the product Rp.Cint.

The value of the product Rp.Cint is also chosen to be high enough for the integrator stage to behave well in integrator mode at the working frequencies considered. (in particular, at the renewal frequency of the input current pulses when the latter are periodic). For this, the product Rp.Cint is chosen to be higher than the inverse of the minimum working frequency at which the detection circuit is desired to operate correctly.

BRIEF DESCRIPTION OF DRAWINGS

Other characteristics and advantages of the invention will become apparent from reading the detailed description that follows, given with reference to the appended drawings in which.

DETAILED DESCRIPTION OF PREFERRED EMBODIMENTS

In the description that follows, the same letter (R1 for example) is used to denote both a circuit component (a resistor for example) and the characteristic numeric value of this component (the value of the resistor for example).

Figure 1:
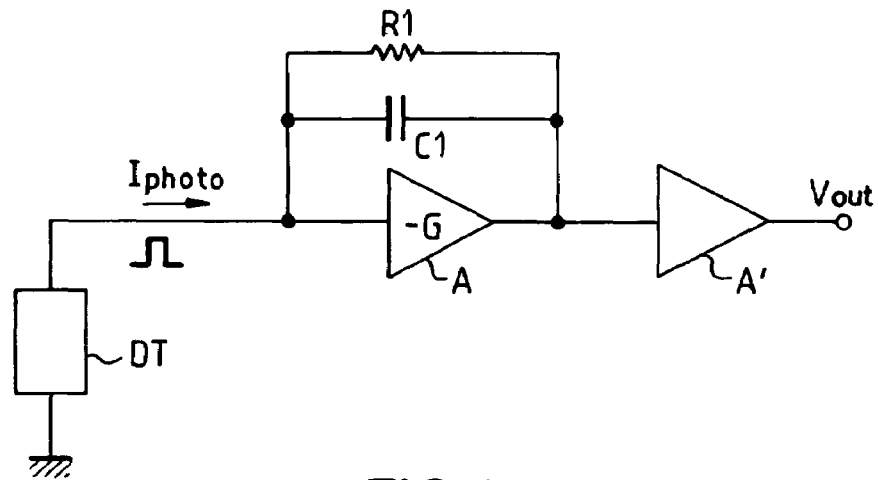
FIG. 1 represents a measurement circuit with transimpedance amplifier.

FIG. 1 first reviews the known principle of a current pulse detection subsystem using a transimpedance type amplifier.

The current to be measured is, for example, a current Iphoto obtained from a radiation detector DT receiving a pulse type radiation (for example a detector of X or gamma rays) and supplying current pulses that are brief (a few nanoseconds) and of low amplitude (a few microamps).

The current Iphoto is applied to the input of a high-gain amplifier (gain −G) denoted A, with high input impedance, and low output impedance (operational amplifier).

The detector can be considered to be a perfect current source of value Iphoto. It could also be considered to have an internal impedance in the form of a resistance and a capacitance, but for the purpose of the explanations below, it will be assumed that the value of this internal impedance is negligible and that all the current Iphoto is applied in full to the input of the amplifier A.

The operational amplifier A has its output looped back to its input via a resistor R1 and a capacitor C1. This duly looped-back amplifier operates as a transimpedance amplifier, provided that the working frequency is well below the cut-off frequency Fc=1/(2πR1.C1). This means that there must be a very high cut-off frequency if the desire is to work with brief pulses. Consequently, the resistor and the capacitor must be of low value in this configuration of the prior art. With R1 being of low value, the output voltage is then low. It is normally necessary to have this transimpedance amplifier followed by a high-gain voltage amplifier A'.

The output voltage Vout of such a measurement circuit is then Vout=-k.R1.Iphoto if k is the gain of the amplifier A', provided that the circuit is working well below the cut-off frequency. Beyond this, the output voltage is no longer representative of the input current.

This configuration does not provide a good trade-off between the bandwidth and the signal-to-noise ratio obtained.

Figure 2:
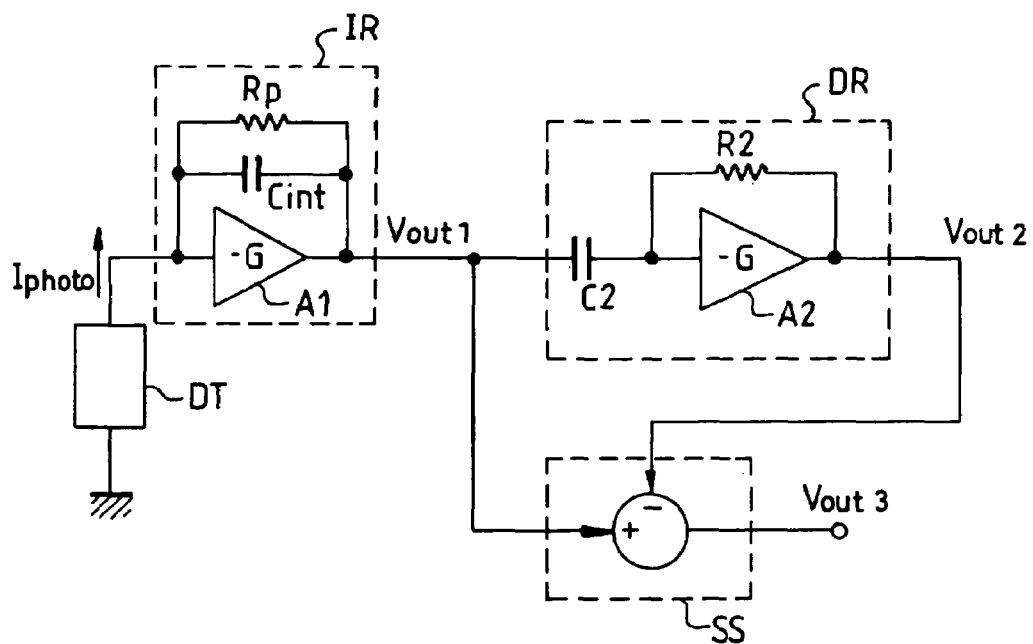
FIG. 2 represents the measurement circuit structure according to the invention.
Figure 3:
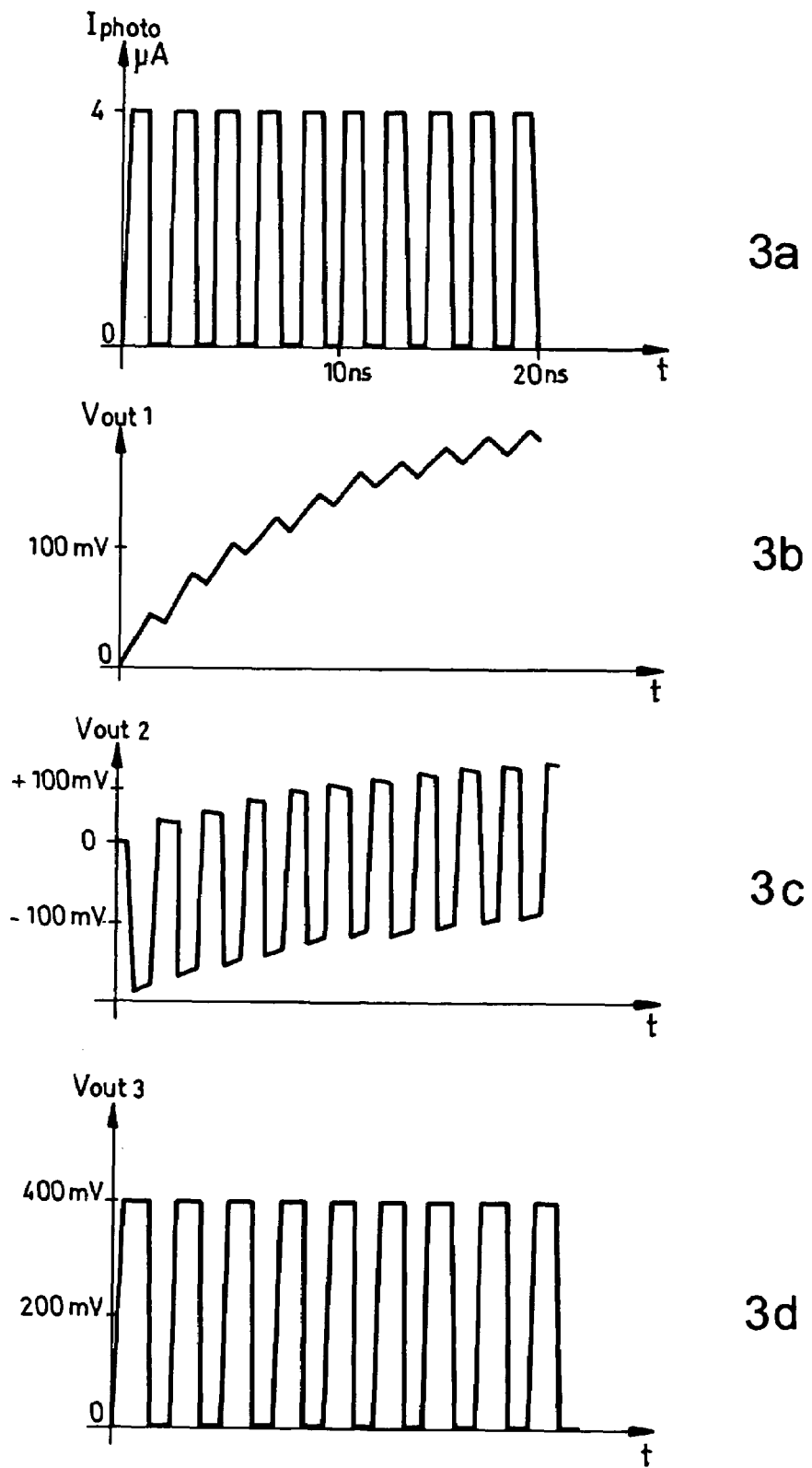
FIG. 3 represents the voltages at the input and at the output of the different stages of the circuit of FIG. 2 in an exemplary application.

FIG. 2 represents the principle of the invention which aims to improve this trade-off. The detection circuit comprises three stages:
- an integrator stage IR, the construction of which is very similar to that of a transimpedance amplifier, but which uses very different numeric values for the resistor and the capacitors because it is used above its cut-off frequency, unlike a transimpedance amplifier of a detection subsystem of the prior art;
- a differentiator stage DR, the input of which receives the output from the integrator stage;
- a subtractor stage SS which receives the outputs from the preceding two stages and which supplies a voltage equal to the difference of the voltages present on these two outputs.

The input current to be measured is in this case still a current denoted by Iphoto, which is, for example, obtained from a photodetector supplying a pulse type current.

The photodetector is even assumed to have a negligible internal impedance and can be considered to be a perfect current source of value Iphoto. This means that the current Iphoto is practically all applied to the input of the integrator stage IR.

For its operation, the detector sometimes needs a DC bias source; this source is not shown to simplify the diagram.

The integrator stage IR comprises an amplifier A1 with intrinsic high gain (value –G), the input of which receives the current Iphoto, which means that the detector is directly connected to the input of the amplifier A1. The amplifier also has a high input impedance and a low output impedance. The amplifier A1 has its output looped back to its input via a resistor Rp in parallel with a capacitor Cint.

The cut-off frequency beyond which this configuration no longer truly supplies a voltage proportional to the current Iphoto but a voltage reduced by at least 3 decibels compared to the voltage obtained for the same current at very low frequency is equal to 1/(2πRp.Cint), and the value of Rp.Cint is chosen such that, if the minimum frequency at which the circuit is desired to work is Fm, then the product Rp.Cint is greater than ½πFm. In other words, a stage similar to a transimpedance amplifier is used as the integrator stage, but it is made to operate above its cut-off frequency such that it is no longer a transimpedance amplifier.

This integrator stage IR then supplies an output voltage Vout1 equal to –Rp.Iphoto/(1+s.Rp.Cint) where s is the sampling frequency, or indeed the Laplace variable, representing the working frequency.

The differentiator stage DR receives this output voltage Vout1. It mainly comprises another amplifier A2 with high intrinsic gain, high input impedance and low output impedance, an input capacitor in series, C2, and a loopback resistor R2. The intrinsic gain of the amplifier A2 is a value –G which may or may not be equal to that of the amplifier A1.

The input capacitor C2 is linked between the output of the integrator stage IT and the input of the amplifier A2. The loopback resistor R2 is connected between the output of the amplifier A2, which is also the output of the differentiator stage, and the input of the amplifier A2. The voltage present on the output of the differentiator stage is denoted Vout2.

The transfer function of this differentiator stage is Vout2/Vout1=–R2.C2.s, which is indeed a differentiation function.

The subtractor stage (SS) has two inputs, of which one receives the output voltage Vout1 from the integrator stage and the other receives the output voltage Vout2 from the differentiator stage. It supplies a voltage Vout1-Vout2 or Vout2-Vout1.

The output from the current measurement circuit is the output from the subtractor stage SS. The overall transfer function is equal to (Vout1-Vout2)/Iphoto. It is therefore equal to (Vout1+Vout1.R2.C2.s)/Iphoto, or even (1+s.R2.C2)(–Rp)/(1+s.Rp.Cint).

The product R2.C2 is preferably chosen to be as close as possible to the product Rp.Cint, and if possible, a match is obtained between these products. The overall transfer function Vout/Iphoto becomes equal to –Rp, which means that it is a transimpedance function, but with a value of Rp which can be significantly greater than that which was obtained with a simple conventional transimpedance amplifier.

The result is that it becomes possible to operate with an excellent bandwidth/signal-to-noise ratio trade-off.

FIGS. 3a, 3b, 3c and 3d respectively represent, by way of illustration, the appearance of a pulsed current Iphoto obtained from a photodetector, the appearance of the voltage Vout1 output from the integrator stage, the appearance of the voltage Vout2 output from the differentiator stage, and the appearance of the output voltage Vout3 from the subtractor stage.

These curves are given by way of example using the following numeric values: Rp=100 kiloohms, Cp=0.1 pF, R2=1 kiloohm, C2=10 pF. The pulsed current is a series of 4000 nanoamp pulses 1 nanosecond wide with a period of 2 nanoseconds. The resistor Rd is $10^9$ ohms and the capacitor Cin is 2 pF.

The simulations carried out show that the cut-off frequency of the measurement circuit according to the invention can be ten times greater than the cut-off frequency of a circuit with transimpedance amplifier, and that the overall noise voltage at the output can be three times lower.

These performance characteristics may be reduced if account is taken of the imperfection of the operational amplifiers, the presence of stray capacitances or resistances, or the imprecision of the pairing of the products Rp.Cint and R2.C2, but they still remain advantageous.

The structure of the measurement circuit according to the invention is differential: the signal is obtained from the difference between an integral and a differential coefficient, which has a compensatory effect on the inevitable voltage offsets in the circuits and on the drift of these offsets according to time or temperature. The effect of the power supply noises or electromagnetic disturbances is also reduced because of this differential operation.

The invention claimed is:
1. Circuit for measuring brief current pulses, comprising:
an integrator stage comprising a first high-gain amplifier having an input and an output, and a loop circuit between said output and said input, said loop having a resistor of value Rp and a capacitor of value Cint connected in parallel;

a differentiator stage comprising a second high-gain amplifier, an input capacitor of value C2 in series between an output of the integrator stage and an input of the second amplifier, the second amplifier having an output looped back to its input via a resistor of value R2;

a subtractor stage receiving on a first input the output from the integrator stage and on a second input an output of the differentiator stage, said subtractor stage having an output for supplying a difference between voltages on its first and second inputs.

2. Circuit for measuring brief current pulses according to claim 1, wherein the product R2.C2 is as close as possible to the product Rp.Cint.

3. Circuit for measuring brief current pulses according to claim 1, wherein the product Rp.Cint is higher than the inverse of a minimum working frequency at which the detection circuit is desired to operate correctly.

4. Circuit for measuring brief current pulses according to claim 2, wherein the product Rp.Cint is higher than the inverse of a minimum working frequency at which the detection circuit is desired to operate correctly.

* * * * *